United States Patent
Wai et al.

(10) Patent No.: US 8,314,479 B2
(45) Date of Patent: Nov. 20, 2012

(54) LEADFRAME PACKAGE WITH RECESSED CAVITY FOR LED

(75) Inventors: Yong Lam Wai, Ipoh (MY); Chan Boon Meng, Ipoh (MY); Phang Hon Keat, Ipoh (MY)

(73) Assignee: Carsem (M) SDN. BHD., Perak Darul Ridzuan (MY)

( * ) Notice: Subject to any disclaimer, the term of this patent is extended or adjusted under 35 U.S.C. 154(b) by 0 days.

(21) Appl. No.: 13/114,760

(22) Filed: May 24, 2011

(65) Prior Publication Data
US 2012/0104421 A1 May 3, 2012

(30) Foreign Application Priority Data

Nov. 2, 2010 (MY) .......................... PI 2010005176

(51) Int. Cl.
*H01L 23/495* (2006.01)
*H01L 21/00* (2006.01)
*H01R 9/00* (2006.01)

(52) U.S. Cl. ............... 257/676; 257/692; 257/E33.066; 257/E23.031; 257/E23.053; 257/E23.06; 361/772; 438/123

(58) Field of Classification Search .................. None
See application file for complete search history.

(56) References Cited

U.S. PATENT DOCUMENTS

| | | | |
|---|---|---|---|
| 6,407,411 B1 * | 6/2002 | Wojnarowski et al. | 257/99 |
| 6,521,916 B2 * | 2/2003 | Roberts et al. | 257/100 |
| 6,646,491 B2 * | 11/2003 | Worley et al. | 327/514 |
| 6,849,867 B2 * | 2/2005 | Roberts et al. | 257/25 |
| 7,105,862 B2 | 9/2006 | Waitl et al. | |
| 7,524,087 B1 | 4/2009 | Aizar et al. | |
| 7,566,159 B2 | 7/2009 | Oon et al. | |
| 7,598,528 B2 | 10/2009 | Oh et al. | |
| 7,655,957 B2 | 2/2010 | Loh et al. | |
| 7,659,551 B2 | 2/2010 | Loh et al. | |
| 2001/0030355 A1 * | 10/2001 | Mclellan et al. | 257/666 |

(Continued)

FOREIGN PATENT DOCUMENTS

WO WO 2008/130140 A1 10/2008

(Continued)

OTHER PUBLICATIONS

Non-Final Office Action of Jul. 17, 2012 for U.S. Appl. No. 13/116,986, 7 pages.

*Primary Examiner* — Alonzo Chambliss
(74) *Attorney, Agent, or Firm* — Kilpatrick Townsend & Stockton LLP

(57) ABSTRACT

An LED package includes a die pad having a bottom surface, an upper surface and a centrally located recessed cavity. The recessed cavity has a chip attach surface between the bottom surface and upper surface and sidewalls that extend from the recessed chip attach surface to the upper surface. The package additionally has leads arranged on opposing sides of the die pad. The leads have a bottom surface that is coextensive with the bottom surface of the die pad and an upper surface coextensive with the upper surface of the die pad. An LED chip is attached to the chip attach surface. The package further includes a package body having an encapsulant which fills space between the die pad and leads forming a bottom encapsulant surface that is coextensive with the bottom surfaces of the die pad and leads.

19 Claims, 10 Drawing Sheets

U.S. PATENT DOCUMENTS

| | | |
|---|---|---|
| 2002/0180345 A1* | 12/2002 | Hen ............................. 313/499 |
| 2003/0080341 A1* | 5/2003 | Sakano et al. ................. 257/79 |
| 2004/0188696 A1 | 9/2004 | Chen et al. |
| 2004/0217450 A1 | 11/2004 | Li et al. |
| 2006/0102917 A1 | 5/2006 | Oyama et al. |
| 2006/0157726 A1 | 7/2006 | Loh et al. |
| 2007/0164408 A1 | 7/2007 | Yeh |
| 2008/0121921 A1 | 5/2008 | Loh et al. |
| 2008/0173883 A1 | 7/2008 | Hussell et al. |
| 2009/0050925 A1 | 2/2009 | Kuramoto et al. |
| 2009/0114936 A1 | 5/2009 | Kashiwao et al. |
| 2009/0267085 A1 | 10/2009 | Lee et al. |
| 2010/0001306 A1 | 1/2010 | Park et al. |
| 2011/0186902 A1* | 8/2011 | Egoshi et al. ................. 257/99 |
| 2011/0217814 A1* | 9/2011 | Gao et al. ..................... 438/113 |

FOREIGN PATENT DOCUMENTS

| | | | |
|---|---|---|---|
| WO | WO 2009/072786 A2 | 6/2009 | |
| WO | WO 2009/082177 A2 | 7/2009 | |

* cited by examiner

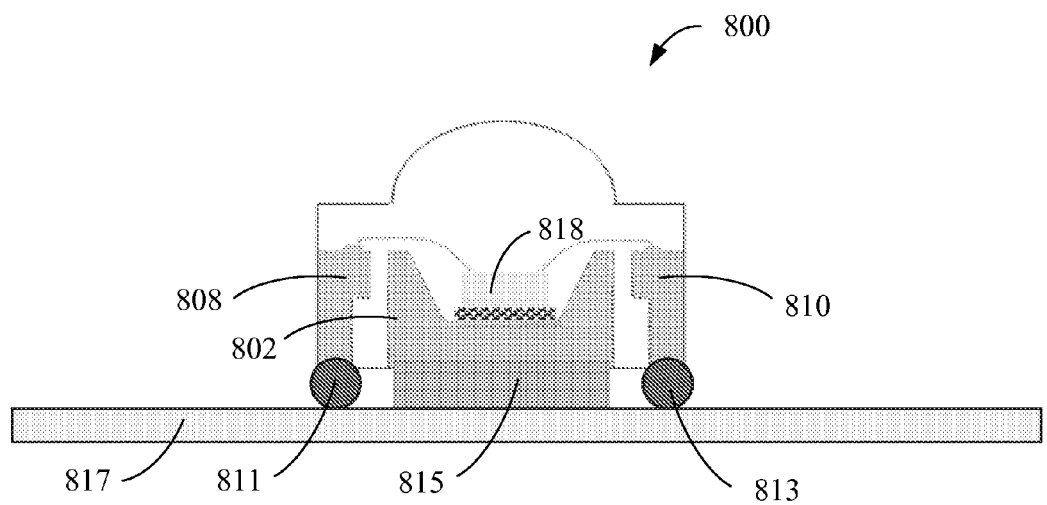
FIG. 8
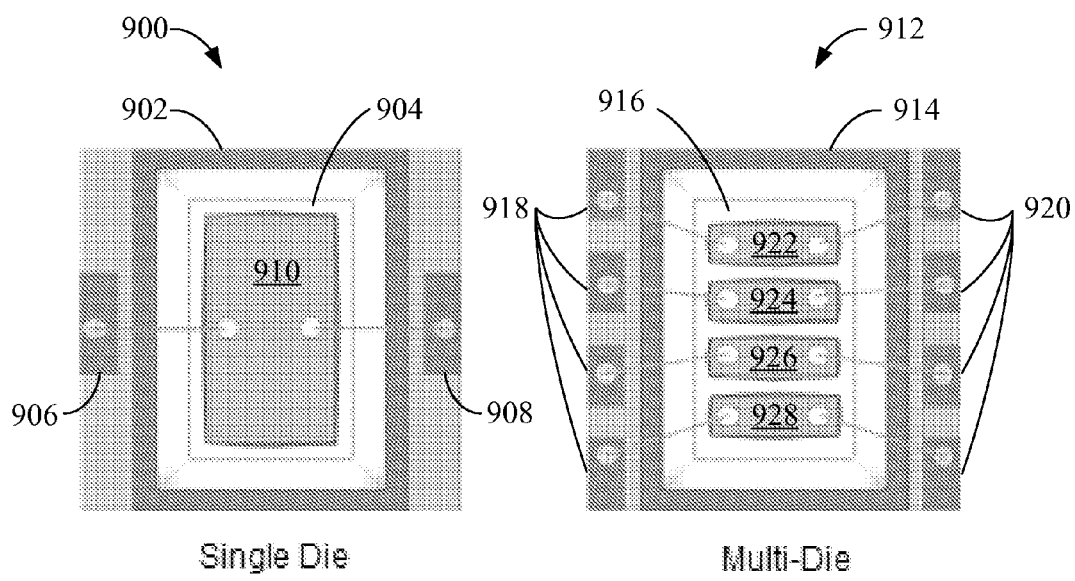
Single Die
FIG. 9A
Multi-Die
FIG. 9B

LPF/S Mounted on Ring

LEADFRAME PACKAGE WITH RECESSED CAVITY FOR LED

CROSS-REFERENCE TO RELATED APPLICATIONS

The present application claims priority to Malaysian Patent Application No. PI 2010005176, filed Nov. 2, 2010, the entire contents of which are incorporated herein by reference for all purposes.

BACKGROUND

The present invention relates generally to integrated circuit (IC) packaging technology. More particularly, embodiments of the present invention pertain to leadframe packages with recessed cavities for light emitting diodes (LEDs).

Leadframes are commonly used to package ICs. One example of a known leadframe IC packaging technique is shown in FIG. 1. FIG. 1 is a simplified cross-sectional view of a conventional molded leadframe package (MLP) 10. MLP 10 includes an IC die 12 attached to a die pad 14 (also referred to as a die paddle) of a leadframe by an adhesive 13. Bonding pads 18 on top of IC die 12 are connected to leads 16 of the leadframe by wirebonds 19. An encapsulant material 20 covers the package including IC die 12, wirebonds 19, and upper surfaces of die pad 14 and leads 16. Die pad 14 and leads 16 are exposed on the bottom to facilitate heat dissipation from IC die 12 and to decrease overall thickness of MLP 10. Half-etched portions 17 of the leadframe are formed on sidewall surfaces of die pad 14 and leads 16. Encapsulant material 20 extends underneath half-etched portion 17 to mechanically secure die pad 14 and leads 16 to MLP 10.

MLP 10 is typically one of many IC packages that are formed in a matrix pattern using a leadframe strip. FIG. 2 is a simplified plan view of a conventional leadframe strip 30 that can be used to form a plurality of leadframe packages. Leadframe strip 30 includes an outer frame 32 to which a number of horizontal and vertical connecting bars 36, 38 are attached. Horizontal and vertical connecting bars 36, 38 define a plurality of inner frames 40 arranged in a matrix that each include an IC receiving area (or die pad). In this example, leadframe strip 30 includes a matrix of 9×9 inner frames 40. Outer frame 32 includes a plurality of positioning holes 34 that can be used to position leadframe strip 30 on appropriate tools during die attach, wirebonding, encapsulation, and singulation processes.

FIG. 3 is an enlarged view of a portion of a leadframe strip. FIG. 3 shows the portion of leadframe strip 30 inside dashed box A of FIG. 2. FIG. 3 shows a die pad 14 and leads 16 within each inner frame 40.

Some LED assembly processes use leadframes similar to the leadframe shown in FIGS. 1 and 3 and that may include die pads, leads, half-etched portions, and encapsulant materials. One example is shown in FIG. 4, where an LED die 42 is positioned directly on top of a die pad 44 and then placed under a dome 45 (or lens) that forms a cavity around LED die 42. There are certain limitations associated with such LED packaging techniques. For example, luminescence efficiency may be low due to light that is dispersed sideways and/or imprecise alignment between LED die 42 and dome 45.

There are also manufacturing limitations associated with current LED packaging techniques. For example, current LED packaging techniques generally suffer from low productivity due to low density leadframes and/or substrates, low production rates (number of units produced per hour), high capital investments, long lead times for new tooling and qualification, and other limitations.

In light of the above and in view of a general trend of shorter produce life cycles for LEDs, improved LED packages and manufacturing methods are desired.

SUMMARY

Embodiments of the present invention provide a LED leadframe package having a recessed cavity in a top surface of a die pad. An LED die can be positioned within the recessed cavity, and sidewalls of the recessed cavity can function as reflectors for light emitted from the LED die. Further, an angle of the sidewalls can be selected to provide a desired beam profile for the light emitted from the LED die (e.g., focused, straight, or wide-angle).

In an embodiment of the present invention, an LED package is provided that includes a die pad having a bottom planar surface, an upper surface, and a centrally located recessed cavity. The recessed cavity has a chip attach surface between the bottom planar surface and the upper surface. The recessed cavity also has sidewalls that extend from the recessed chip attach surface to the upper surface. The package additionally has first and second leads arranged on opposing sides of the die pad. The first and second leads have a bottom planar surface that is coextensive with the bottom planar surface of the die pad and an upper planar surface that is coextensive with the upper surface of the die pad. An LED chip is attached to the chip attach surface within the recessed cavity. The LED chip has first and second bonding pads located on an upper surface thereof. The first and second bonding pads are electrically connected to the first and second leads by first and second conductors respectively. The package further includes a package body having an encapsulant, wherein the encapsulant fills space between the die pad and first and second leads forming a bottom encapsulant surface that is coextensive with the bottom planar surface of the die pad and the bottom planar surface of the first and second leads.

In another embodiment, a plurality of LED chips are attached to the chip attach surface of the recessed cavity of the die pad. Each of the LED chips has first and second bonding pads located on an upper surface of the chip. A plurality of sets of first and second leads are arranged on opposing sides of the die pad. One set of first and second leads are provided for each of the LED chips in the plurality of chips such that each set the first and second bonding pads are electrically connected to each set of the first and second leads by each set of first and second conductors respectively.

In another embodiment of the present invention, a leadframe for use in making LED packages is provided. The leadframe includes a rectangular outer frame having an upper planar surface and a lower planar surface. The leadframe additionally includes a plurality of inner frames arranged in a matrix pattern within the outer frame. Each of the inner frames has a chip containing area and first and second leads arranged on opposing sides of the chip containing area. The chip containing area and first and second leads have a bottom surface coextensive with the lower planar surface and have an upper surface coextensive with the upper planar surface. The chip containing area further includes a centrally located recessed cavity having a recessed planar surface between the upper and lower planar surfaces of the leadframe and having sidewalls that extend from the recessed planar surface to the upper surface.

In yet another embodiment, a method of manufacturing an LED package is provided. The method includes mounting a large panel frame/substrate (LPF/S) having a substantially square shape to a ring. The LPF/S includes a plurality of die pads and a corresponding plurality of leads arranged in a matrix pattern. Each of the die pads includes a planar chip attach surface. An LED chip is attached to the planar chip attach surface of each of the die pads. An encapsulant material is applied overlaying the LED chips and at least a part of the LPF/S. Each die pad and corresponding leads are separated from the LPF/S to form individual LED packages. The steps of attaching the LED chips and applying the encapsulant material are performed while the LPF/S is mounted to the taped ring.

In some embodiments, applying the encapsulant material further includes providing an array mold cavity, dispensing the encapsulant material into the array mold cavity, engaging the array mold cavity including the encapsulant material with the LPF/S including the LED chips, and curing the encapsulant material.

Many benefits are achieved by way of the present invention over conventional techniques. For example, some embodiments include a single piece die pad with a recessed cavity where an LED chip can be attached. Sidewalls of the recessed cavity can be used to reflect light emitted from the LED chip. Using a single piece die pad with a recessed cavity can simplify the LED packaging process because additional steps for forming reflective surfaces are not required. As another example, some embodiments utilize light reflectors that can be inserted within the recessed cavity. The light reflectors can be used to modify light emitting properties of the LED package without requiring changes to the leadframe. Thus, embodiments of the present invention can provide LED packages with various luminescence patterns and efficiencies while reducing manufacturing complexity and shortening manufacturing leadtimes. Depending upon the embodiment, one or more of these benefits may exist. These and other benefits are described throughout the specification and more particularly below.

BRIEF DESCRIPTION OF THE DRAWINGS

FIG. 8 is a simplified cross-sectional view of an LED package having external I/O interconnects and an external heat sink in accordance with an embodiment of the present invention;

FIGS. 9A-9B are simplified plan views of LED packages according to embodiments of the present invention;

DETAILED DESCRIPTION

Embodiments of the present invention provide a LED leadframe package having a recessed cavity in a top surface of a die pad. An LED die can be positioned within the recessed cavity, and sidewalls of the recessed cavity can function as reflectors for light emitted from the LED die. In an embodiment, the sidewalls can be coated with a glossy or matte finish to modify reflectivity of the sidewalls. In another embodiment, a light reflector can be inserted within the recessed cavity. In each of these embodiments, a shape of the recessed cavity can vary from circular, square, hexagonal, etc. Further, an angle of the sidewalls can be selected to provide a desired beam profile for the light emitted from the LED die (e.g., focused, straight, or wide-angle).

Figure 1:
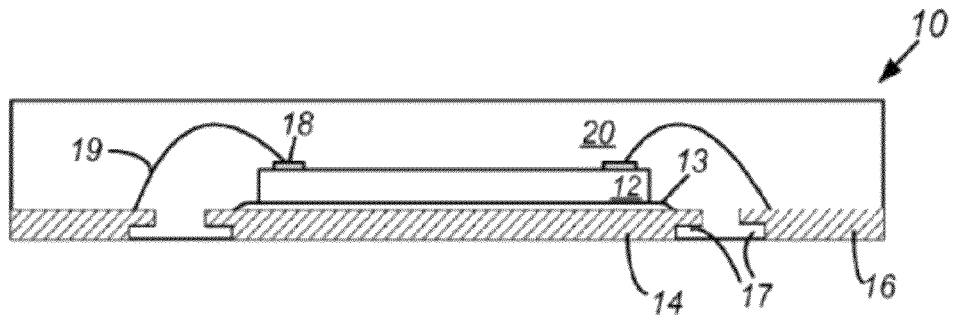
FIG. 1 is a simplified cross-sectional view of a conventional molded leadframe package.
Figure 2:
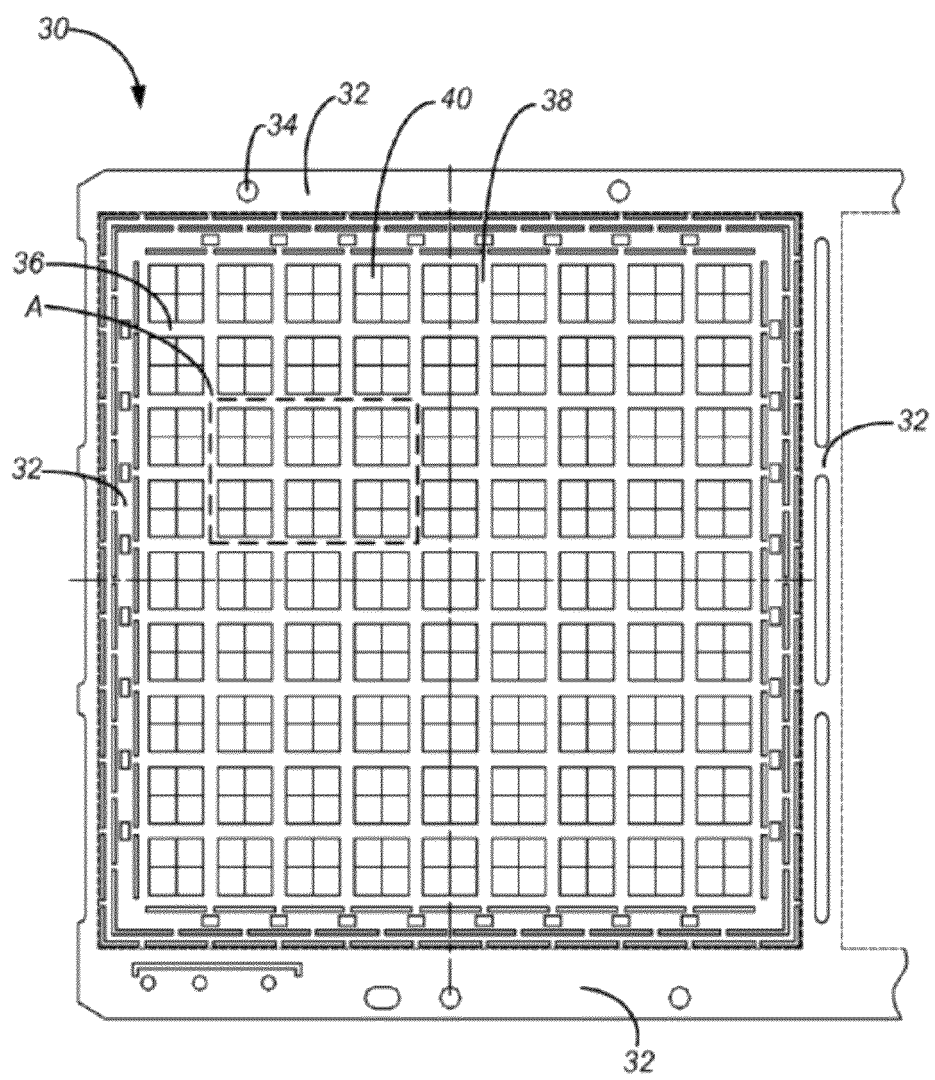
FIG. 2 is a simplified plan view of a conventional leadframe strip that can be used to form a plurality of leadframe packages.
Figure 3:
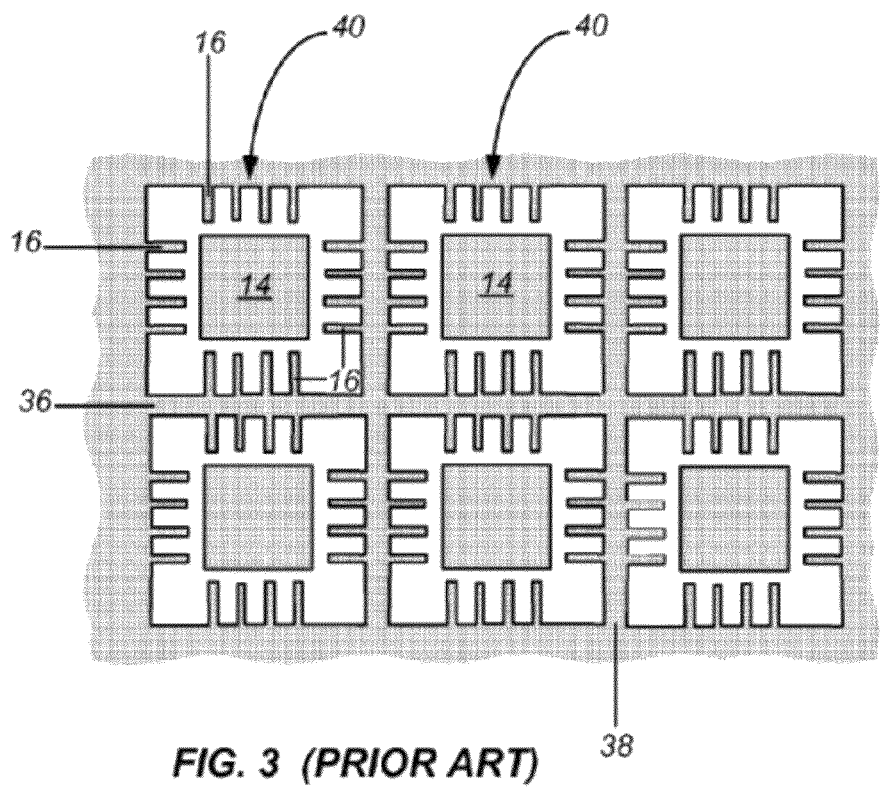
FIG. 3 is an enlarged view of a portion of a leadframe strip.
Figure 4:
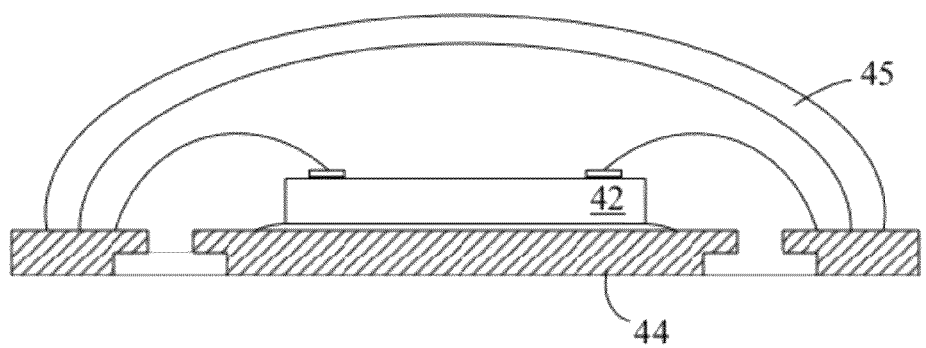
FIG. 4 is a simplified cross-sectional view of a conventional pre-molded type package for housing an LED.
Figure 5:
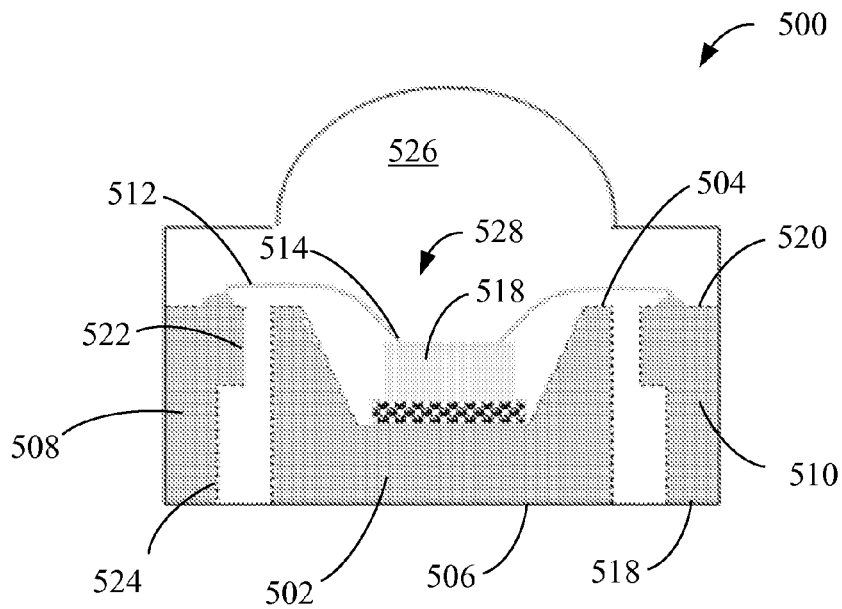
FIG. 5 is a simplified cross-sectional view of an LED package according to an embodiment of the present invention.

FIG. 5 is a simplified cross-sectional view of an LED package 500 according to an embodiment of the present invention. This diagram is merely an example that should not unduly limit the scope of the claims. One of ordinary skill in the art would recognize many variations, alternatives, and modifications. LED package 500 includes a die pad 502 having an upper surface 504 and a bottom planar surface 506. LED package 500 further includes leads 508, 510 arranged on opposite sides of die pad 502. Die pad 502 and leads 508, 510 are typically made of a conductive material such as metal. Electrically conducting wires, such as wire 512, connect each of the leads 508, 510 to a bonding pad, such as bonding pad 514, located on an LED chip 518. Leads 508, 510 have a bottom planar surface 518 that is coextensive with bottom planar surface 506 of die pad 502. Bottom planar surface 506 of die pad 502 may be exposed to an ambient surrounding or attached to an external heat slug to enhance dissipation of heat generated by LED chip 518. Leads 508, 510 also have an upper planar surface 520 that is coextensive with upper surface 504 of die pad 502. Further, leads 508, 510 have an upper inner sidewall surface 522 facing die pad 502 that extends from upper surface 520 to a lower edge between upper surface 520 and bottom planar surface 518. Leads 508, 510 also have a lower inner sidewall surface 524 facing die pad 502 that intersects with bottom planar surface 518 and an intermediate surface that extends from the lower edge of upper inner sidewall surface 522 to lower inner sidewall surface 524.

An encapsulant material 526 covers upper planar surface 504 of die pad 502 and upper planar surface 520 of leads 508, 510. Encapsulant material 526 also at least partially covers lower inner sidewall surface 524 and upper inner sidewall surface 522 of leads 508, 510. Encapsulant material 526 fills recessed cavity 528 to cover LED chip 518 and form part of LED package 500. Encapsulant material 526 also fills spaces between the leads 508, 510 and the die pad 502 wherein a bottom surface of encapsulant material 526 is coextensive with bottom planar surface 518 of leads 508, 510 and with bottom planar surface 506 of die pad 502. In an embodiment, encapsulant material 526 forms a lens and a package lid.

A chip attach surface extends along a bottom of recessed cavity 528 and sidewalls extend from the bottom of recessed cavity 528 to upper planar surface 504 of die pad 502. LED chip 518 is attached to the chip attach surface by an adhesive. The sidewalls of recessed cavity 528 may be formed in any particular shape (e.g., circular, rectangular, hexagonal, etc.) depending on the particular application. In one embodiment, the sidewalls of the recessed cavity 520 are coated with a glossy or matte finish to modify reflectivity of the sidewalls.

Figure 6:
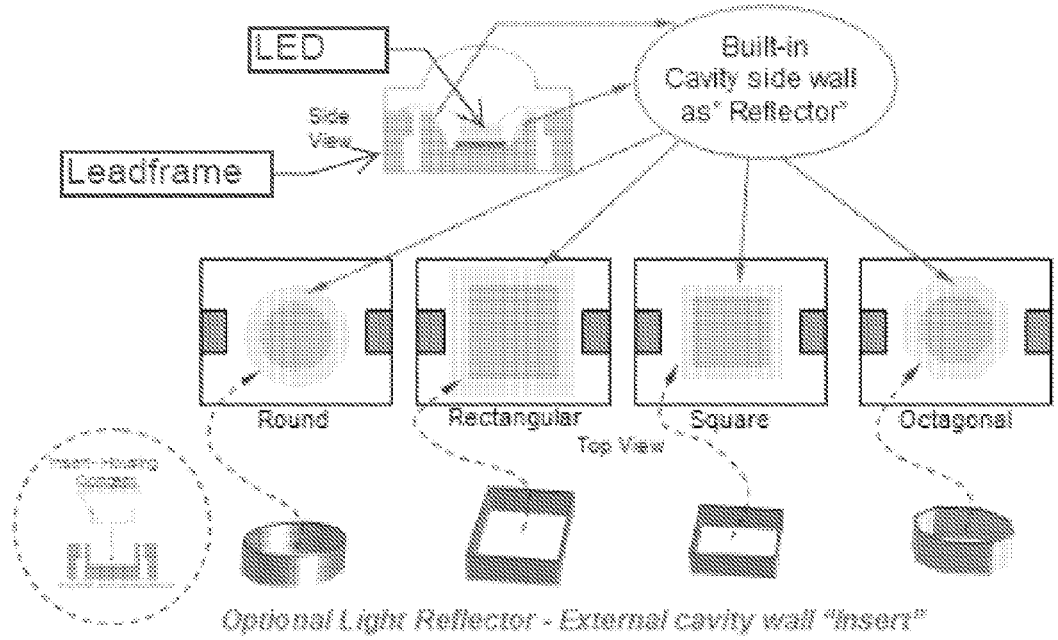
FIG. 6 is a simplified diagram of exemplary light reflectors and inserts according to an embodiment of the present invention.

In some embodiments, a light reflector may be inserted into recessed cavity 528 to reflect light emitted from LED chip 518. FIG. 6 is a simplified diagram of exemplary light reflectors and inserts according to an embodiment of the present invention. As shown in FIG. 6, the light reflectors may be formed in various shapes and profiles including circular, rectangular, octagonal, etc. The different shapes may be used to modify properties of the reflected light beam from LED chip 518. Similar to recessed cavity 528, sidewalls of the light reflectors can have a glossy or matte finish depending on the particular application. The sidewalls may also be plated with a plating material or may be of a particular color to enhance reflective properties of the sidewalls.

In an embodiment, a shape of a portion of the light reflector that fits into recessed cavity 528 may be standardized. This way, a standardized die pad 502 and recessed cavity 528 can be used with light reflectors having sidewalls of any shape.

Figure 7:
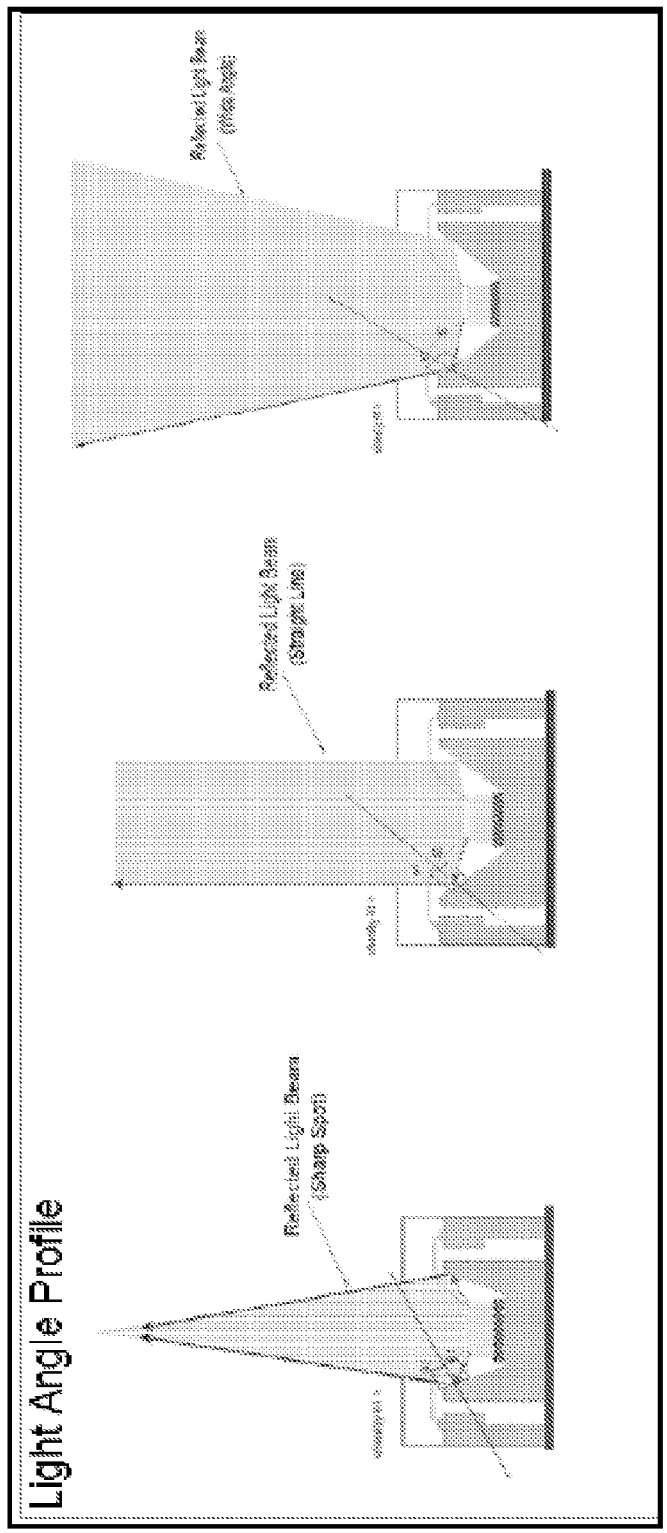
FIG. 7 is a simplified diagram of different light beam profiles produced by LED packages formed in accordance with an embodiment of the present invention.

FIG. 7 is a simplified diagram of different light beam profiles produced by LED packages formed in accordance with an embodiment of the present invention. The different profiles can be produced by modifying an angle of the sidewalls in the recessed cavity and/or an angle of the sidewalls of a light reflector. As shown in FIG. 7, light beams having focused profiles, straight profiles, or wide-angle profiles can be produced. Additionally, the sidewalls may have a bend with multiple angles or be curved depending on the desired light beam profile.

FIG. 8 is a simplified cross-sectional view of an LED package 800 having external I/O interconnects 811, 813 and an external heat sink 815 in accordance with an embodiment of the present invention. External I/O interconnects 811, 813 may be used to connect leads 808, 810, respectively, to a circuit board 817 as shown in FIG. 8. External I/O interconnects 811, 813 may be formed using any conductive material (e.g., solder). In some embodiments, an external heat slug 815 may be coupled to a bottom of die pad 802 to increase heat dissipation from an LED chip 818. External heat slug 815 may be formed using any material having good heat conductivity (e.g., aluminum). Heat dissipation may also be increased by increasing a thickness of die pad 802. In an embodiment, for example, a thickness of die pad 802 is increased to between about 12-20 mil compared to a standard thickness of between about 6-8 mil. An external heat slug and/or a die pad having an increased thickness may be used to lower a temperature of packages containing high power LEDs.

FIGS. 9A-9B are simplified plan views of LED packages according to embodiments of the present invention. FIG. 9A shows a LED package 900 having a single LED chip 910 attached to a die pad 902. As explained above with regard to FIG. 5, LED chip 910 may be disposed on a chip attach surface 904 that extends along a bottom surface of a recessed cavity. Leads 906, 908 are disposed on opposing sides of die pad 902, and bonding wires electrically connect leads 906, 908 to respective bonding pads on LED chip 910. Additional leads may be disposed on a top and bottom of die pad 902.

As would be appreciated by one of ordinary skill in the art, increasing a number of LED chips in an LED package can increase illumination and/or provide for a broader spectrum of emitted light. Accordingly, FIG. 9B shows a LED package 912 having a plurality of LED chips 922, 924, 926, 928 attached to a die pad 914. LED chips 922, 924, 926, 928 are disposed on a chip attach surface 916 that extends along a bottom surface of a recessed cavity. A plurality of leads 918, 920 are disposed on opposing sides of die pad 914, and bonding wires electrically connect the plurality of leads 918, 920 to respective bonding pads on LED chips 922, 924, 926, 928. Additional leads may be disposed on a top and bottom of die pad 914. Although LED package 912 includes four LED chips in this example, any number of LED chips may be used in an LED package in accordance with embodiments of the invention.

Figures 10A, 10B:
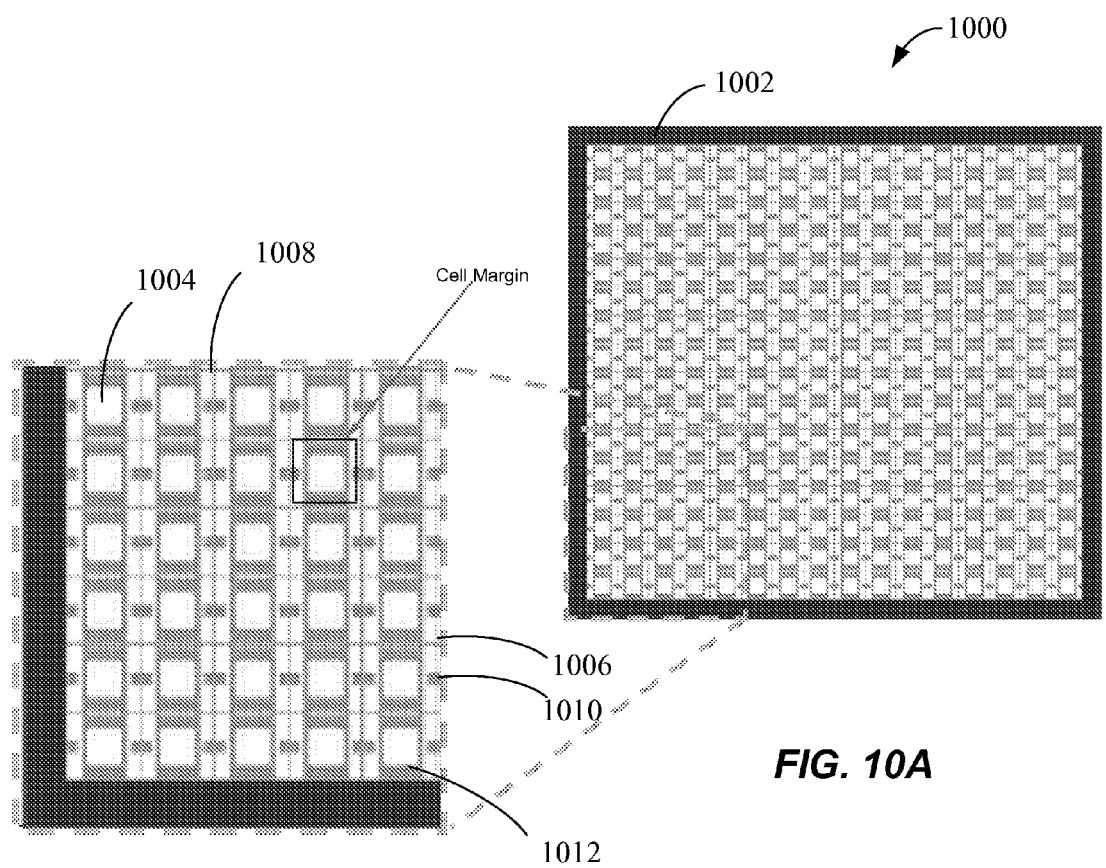
FIGS. 10A-10B are simplified plan views of a large panel frame/substrate that may be used in making LED packages according to an embodiment of the present invention.

FIGS. 10A-10B are simplified plan views of a large panel frame/substrate (LPF/S) 1000 that may be used in making LED packages according to an embodiment of the present invention. As shown in FIG. 10A, LPF/S 1000 has a rectangular outer frame 1002. In an embodiment, outer frame 1002 has a size of 178 mm×178 mm. As would be appreciated by one of ordinary skill in the art, outer frame 1002 may be larger or smaller depending on the particular application. A plurality of inner frames are arranged in a matrix pattern within outer frame 1002. FIG. 10B is an enlarged view of a portion of LPF/S 1000 showing some of the inner frames. As shown in FIG. 10B, the plurality of inner frames are attached to horizontal and vertical connecting bars 1006, 1008. Each of the inner frames includes a chip attach surface 1004 extending along a bottom of a recessed cavity. An LED chip may be attached to the chip attach surface 1004 in each of the inner frames. Each of the inner frames also include leads 1010 arranged on opposing sides of the chip attach surface 1004. As explained above with regard to FIG. 6, a light reflector 1012 may be inserted into the recessed cavity of each frame.

Figure 11:
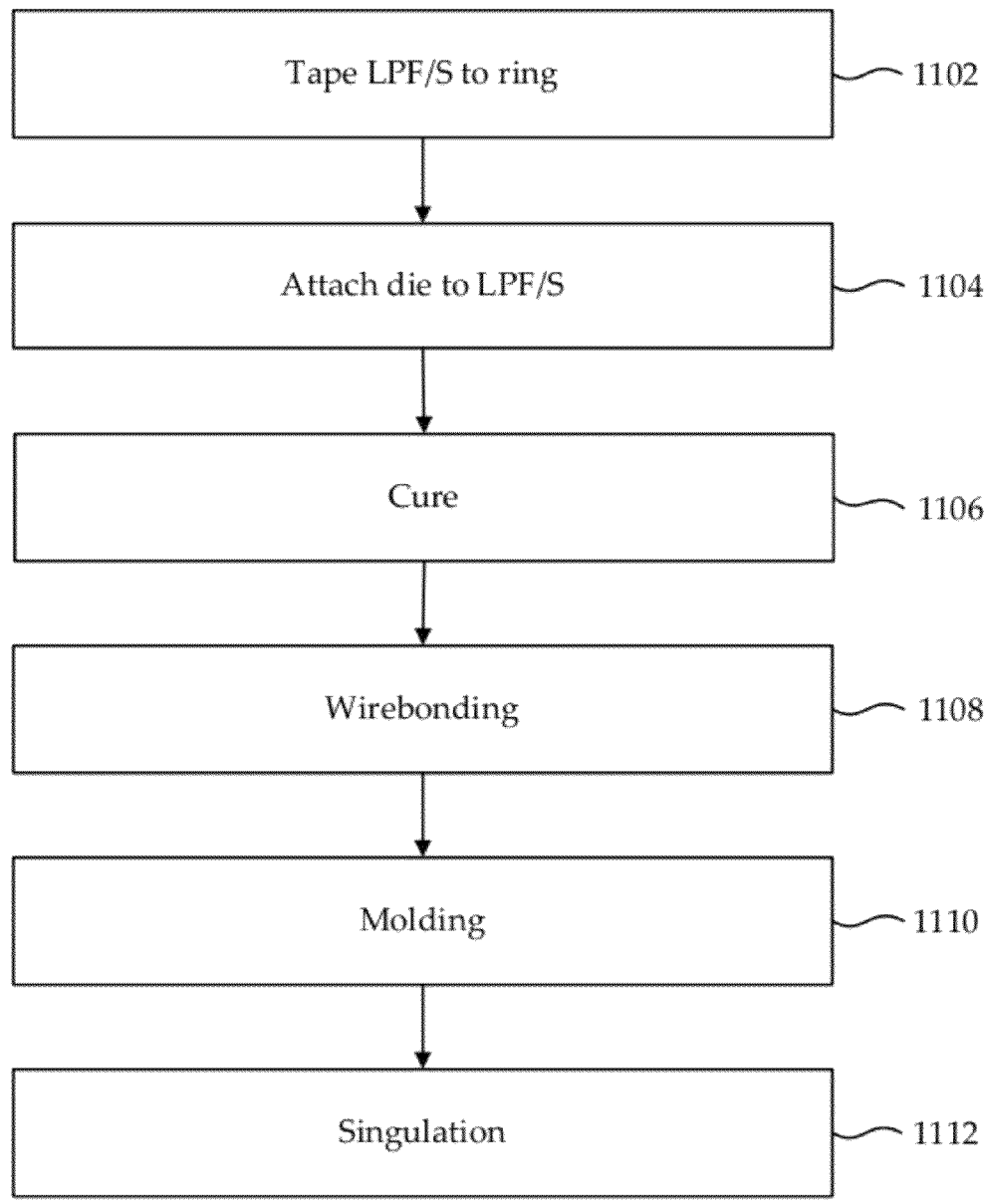
FIG. 11 is a flowchart illustrating an exemplary process of assembling a molded LED package according to an embodiment of the present invention.

FIG. 11 is a flowchart illustrating an exemplary process of assembling a molded LED package according to an embodiment of the present invention. Some embodiments of the invention provide increased packaging efficiency by using a LPF/S that is larger than conventional leadframes. As an example, a LPF/S having a size of up to 178 mm×178 mm or larger may be used in some embodiments. This is compared with conventional leadframes that may have a size of about 40 mm×140 mm. These features allow an extremely high density that is not possible with a conventional LED packaging techniques. The increased packaging efficiency gained by using the LPF/S can reduce assembly costs. As described more fully below, the LPF/S may be mounted to a carrier or ring to support the LPF/S during the assembly process. Further, the LPF/S may be transported during assembly processes using a handler that provides precise movement in both "X" and "Y" directions (e.g., forward/backward and lateral directions).

Figure 12:
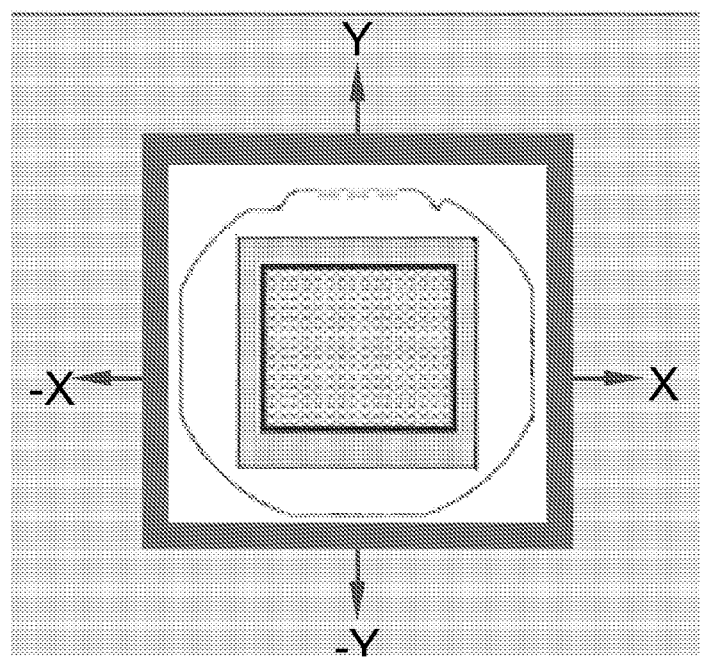
FIG. 12 is a simplified diagram of a large panel frame/substrate mounted on a taped ring for processing according to an embodiment of the present invention.

Steps 1102-1108 of FIG. 11 are typically considered part of a front of line (FOL) phase, and steps 1110-1112 are typically considered part of an end of line (EOL) phase. At step 1102, a LPF/S is mounted to a ring and offloaded to a slot film frame cassette. The ring provides support for the LPF/S and enables precise movement during the assembly process. In an embodiment, the ring is a metal support made from aluminum or stainless steel. The LPF/S may be mounted to the ring using, for example, an adhesive high temperature tape that can withstand temperatures that may exceed 200° C. during wirebonding and molding steps. As shown in FIG. 12, an LPF/S mounted to a circular-shaped ring can be transported in both "X" and "Y" directions during the assembly process. In step 1104, LED chips or die are attached within recessed cavities of die pads on the LPF/S. In an embodiment, the LED chips may be attached using an adhesive. The LED chips are typically placed onto the die pads using a pick and place method. Movement of the ring in both the "X" and "Y" directions enables precise placement of the LED chips within the recessed cavities of the die pads. In step 1106, the adhesive used to attached the LED chips is cured. In an embodiment, the cure may include a thermal treatment at temperatures of between 100° C. to 200° C. for between 1 hour to 3 hours. In step 1108, a wirebonding process is used to electrically connect leads on the LPF/S to respective bonding pads on the LED chips using bonding wires. In some embodiments, the assembly process may also include dispensing phosphor over the LED chips to enhance or change a color of lighted emitted from the LEDs. Some embodiments may also include one or more cleaning steps that may include a plasma process in accordance with known techniques.

Figure 13A:
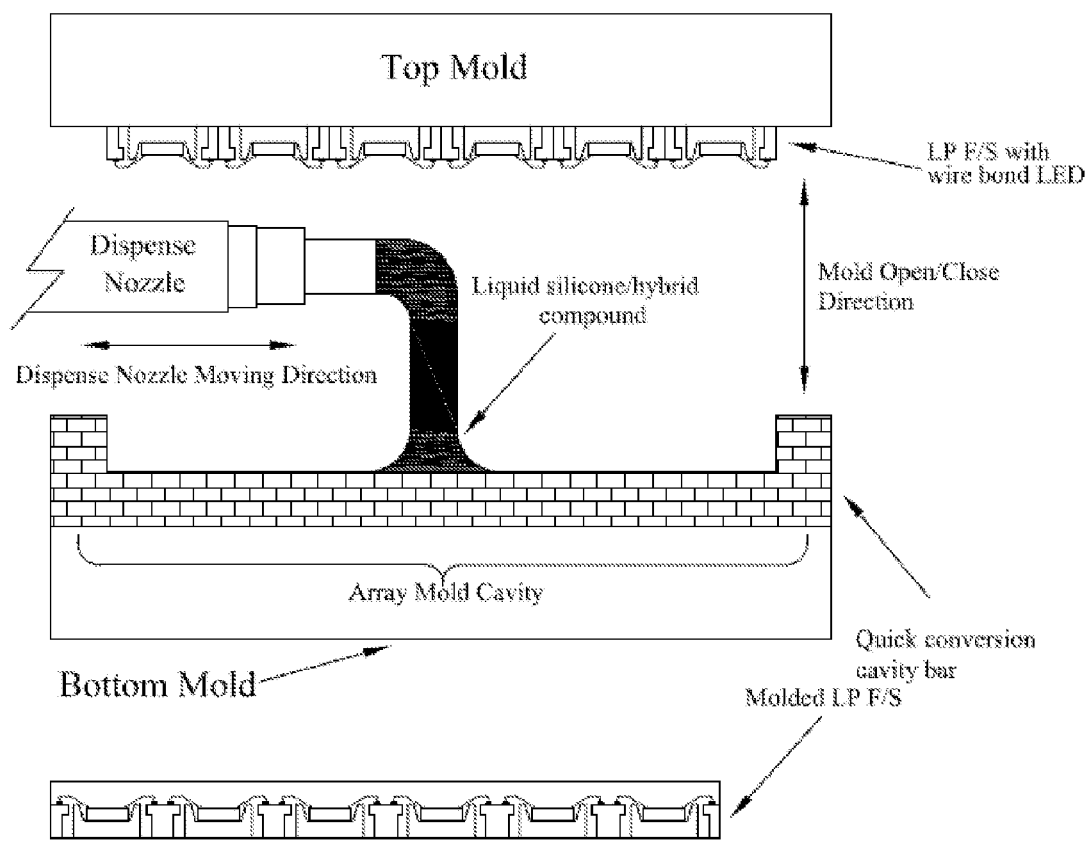
FIGS. 13A-13B are simplified cross-sectional views illustrating a molding process in assembly of an LED leadframe package according to an embodiment of the present invention.
Figure 13B:
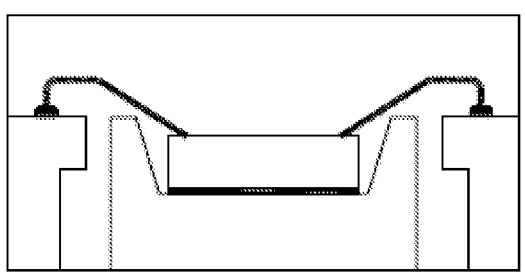
Figure 14A:
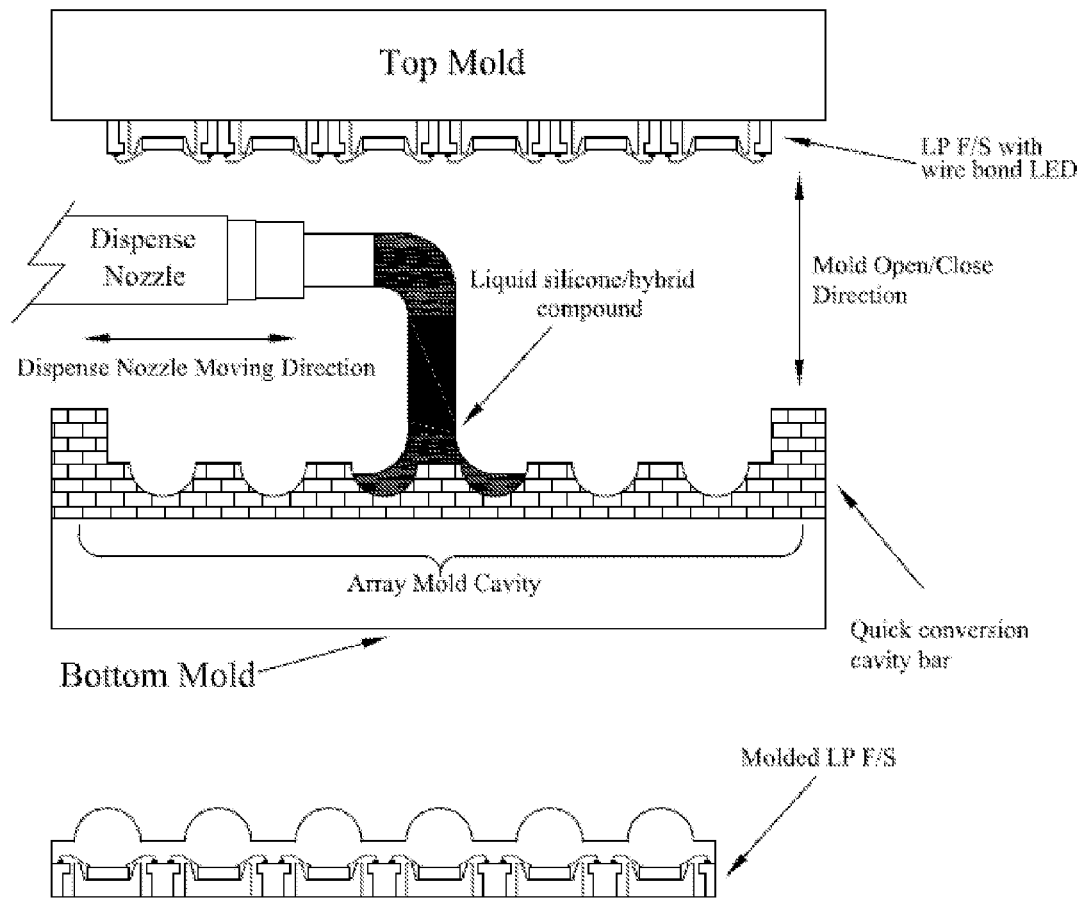
FIGS. 14A-14B are simplified cross-sectional views illustrating a molding process in assembly of an LED leadframe package according to another embodiment of the present invention.
Figure 14B:
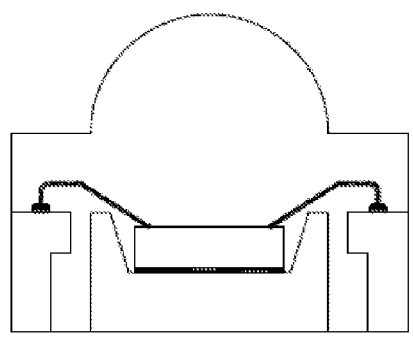

The EOL phase includes a molding process at step 1110. In an embodiment, the molding process includes dispensing an encapsulant material in an array mold cavity and submerging the LPF/S and attached LED chips in the encapsulant material. This can be shown with reference to FIGS. 13A-13B and 14A-14B, which illustrate exemplary molding processes for forming LED packages. As illustrated in FIG. 13A, an encapsulant material, such as a silicone hybrid compound, may be injected in an array mold cavity using a dispense nozzle. The array mold cavity is then engaged with the LPF/S and the encapsulant material is cured to form an array of LED packages. The array of LED packages are separated at step 1112 using a singulation process to provide a plurality of LED packages. An exemplary LED package formed using the array mold cavity of FIG. 13A is illustrated in FIG. 13B. FIGS. 14A-14B provide examples of LED packages having a "dome" shape that may be formed by changing the array mold cavity illustrated in FIG. 14A. Array mold cavities having other designs may be used with in accordance with embodiments of the invention. The above molding processes are in contrast to conventional techniques that use individual as opposed to array mold cavities.

It should be appreciated that the specific steps illustrated in FIG. 11 provide a particular method in accordance with an embodiment of the present invention. Other sequences of steps may be performed according to alternative embodiments. For example, the steps outlined above may be performed in a different order. Moreover, the individual steps illustrated in FIG. 11 may include multiple sub-steps that may be performed in various sequences as appropriate to the individual step. Furthermore, additional steps may be added or removed depending on the particular application. One of ordinary skill in the art would recognize many variations, modifications, and alternatives.

Although specific embodiments of the present invention have been described in detail, it will be apparent to one skilled in the art that various changes and modification can be made therein without departing from the spirit and scope thereof.

The invention claimed is:

1. A light emitting diode (LED) package comprising:
   a metal die pad having a bottom planar surface, an upper surface, and a centrally located recessed cavity, the recessed cavity having a planar chip attach surface between the bottom planar surface and the upper surface, the recessed cavity also having sidewalls that extend from the recessed planar chip attach surface to the upper surface;
   first and second metal leads arranged on opposing sides of the die pad, the first and second metal leads having a bottom planar surface that is coextensive with the bottom planar surface of the die pad and an upper planar surface that is coextensive with the upper surface of the die pad;
   an LED chip attached to the chip attach surface within the recessed cavity, the LED chip having first and second bonding pads located on an upper surface thereof;
   first and second conductors that electrically connect the first and second bonding pads to the first and second metal leads, respectively; and
   a package body comprising an encapsulant, wherein the encapsulant fills a space between the metal die pad and the first and second metal leads and forms a bottom encapsulant surface that is coextensive with the bottom planar surfaces of the die pad and the bottom planar surface of the first and second metal leads.

2. The LED package set forth in claim 1 wherein the sidewalls of the recessed cavity of the die pad form an obtuse angle at a junction where the sidewalls intersect the planar chip attach surface.

3. The LED package set forth in claim 2 wherein the sidewalls of the recessed cavity are plated with a metallic plating material to enhance the reflective properties of the sidewalls.

4. The LED package set forth in claim 1 wherein the first and second leads have (i) an upper inner sidewall surface facing the die pad that extends from the upper surface of the leads to a lower edge between the upper surface and bottom surfaces, (ii) a lower inner sidewall surface facing the die pad that intersects with the bottom surface and (iii) an intermediate surface that extends from the lower edge of the upper sidewall surface to the lower inner sidewall surface, and wherein the encapsulant material covers the lower inner sidewall surface of the first and second leads and at least partially covers the upper inner sidewall surface of the first and second leads.

5. The LED package set forth in claim 1 further comprising an insert that mates with the recessed cavity within the die pad to function as an LED light reflector, the insert having sidewalls that extend from the planar chip attach surface of the recessed cavity to the upper surface and form an obtuse angle at the junction where the sidewalls intersect the recessed planar surface.

6. The LED package set forth in claim 1 wherein the recessed cavity has either a rectangular or square shape.

7. The LED package set forth in claim 1 wherein the recessed cavity has either a circular, hexagonal or octagonal shape.

8. The LED package set forth in claim 1 wherein the sidewalls of the recessed cavity have a glossy finish and function as an LED reflector.

9. The LED package set forth in claim 1 wherein the sidewalls of the recessed cavity have a matte finish and function as an LED reflector.

10. The LED package set forth in claim 1 further comprising:
    a plurality of LED chips attached to the planar chip attach surface, each of the LED chips having first and second bonding pads located on an upper surface of the chip;
    a plurality of sets of first and second metal leads arranged on opposing sides of the metal die pad, one set of first and second leads for each of the LED chips in the plurality of chips; and
    a plurality of sets of first and second conductors, each set electrically connecting the first bonding pad of its respective LED chip to a corresponding first metal lead and electrically connecting the second bonding pad of its respective LED chip to a corresponding second metal lead.

11. A leadframe for use in making light emitting diode (LED) packages, the leadframe comprising:
- a rectangular outer metal frame having an upper planar surface and a lower planar surface;
- a plurality of inner frames arranged in a matrix pattern within the outer metal frame, each of the inner frames comprising a chip containing area and first and second leads arranged on opposing sides of the chip containing area;
- wherein the chip containing area and first and second leads have a bottom surface coextensive with the lower planar surface and have an upper surface coextensive with the upper planar surface, the chip containing area further comprising a centrally located recessed cavity having a recessed planar surface between the upper and lower planar surfaces of the leadframe and having sidewalls that extend from the recessed planar surface to the upper surface.

12. The leadframe set forth in claim 11 wherein the sidewalls of the recessed cavity form an obtuse angle at the junction where the sidewalls intersect the recessed planar surface.

13. The leadframe set forth in claim 12 wherein the sidewalls of the recessed cavity are plated with a metallic plating material to enhance the reflective properties of the sidewalls.

14. The leadframe set forth in claim 11 wherein the first and second leads have (i) an upper inner sidewall surface facing the chip containing area that extends from the upper surface of the leads to a lower edge between the upper surface and bottom surfaces, (ii) a lower inner sidewall surface facing the chip containing area that intersects with the bottom surface and (iii) an intermediate surface that extends from the lower edge of the upper sidewall surface to the lower inner sidewall surface.

15. The leadframe set forth in claim 11 further comprising an insert that mates with the recessed cavity within the chip containing area to function as an LED light reflector, the insert having sidewalls that extend from the recessed planar surface of the recessed cavity to the upper surface and form an obtuse angle at the junction where the sidewalls intersect the recessed planar surface.

16. The leadframe set forth in claim 11 wherein the recessed cavity has either a rectangular or square shape.

17. The leadframe set forth in claim 11 wherein the recessed cavity has either a circular, hexagonal or octagonal shape.

18. The leadframe set forth in claim 11 wherein the sidewalls of the recessed cavity have a glossy finish and function as an LED reflector.

19. The leadframe set forth in claim 11 wherein the sidewalls of the recessed cavity have a matte finish and function as an LED reflector.

* * * * *